(12) United States Patent
Qiu et al.

(10) Patent No.: US 8,367,221 B2
(45) Date of Patent: Feb. 5, 2013

(54) ORGANIC LIGHT EMITTING DEVICE WITH CATHODE INTERFACE MODIFICATION LAYER AND FABRICATION METHOD THEREOF

(75) Inventors: Yong Qiu, Beijing (CN); Lian Duan, Beijing (CN); Yang Li, Beijing (CN); Guohui Zhang, Beijing (CN)

(73) Assignees: Tsinghua University, Beijing (CN); Beijing Visionox Technology Co., Ltd., Beijing (CN); Kunshan Visionox Display Co., Ltd., Jiangsu (CN)

( * ) Notice: Subject to any disclaimer, the term of this patent is extended or adjusted under 35 U.S.C. 154(b) by 717 days.

(21) Appl. No.: 12/427,846

(22) Filed: Apr. 22, 2009

(65) Prior Publication Data

US 2009/0267499 A1    Oct. 29, 2009

(30) Foreign Application Priority Data

Apr. 24, 2008   (CN) .......................... 2008 1 0104832

(51) Int. Cl.
*H01L 51/54* (2006.01)
(52) U.S. Cl. ............ 428/690; 428/917; 427/58; 427/66; 313/504
(58) Field of Classification Search .................. None
See application file for complete search history.

(56) References Cited

U.S. PATENT DOCUMENTS

| 5,071,926 | A  | * | 12/1991 | Drent | 525/539 |
| 6,391,482 | B1 | * | 5/2002 | Matsuo et al. | 428/690 |
| 2001/0051284 | A1 | * | 12/2001 | Ueda et al. | 428/690 |
| 2003/0116775 | A1 | * | 6/2003 | Matsuo et al. | 257/98 |

OTHER PUBLICATIONS

Longuet-Higgins, H. C. "39. The structure of some electron-deficient molecules" Journal of the Chemical Society 1946, 139-143. Year of publication: 1946.*

\* cited by examiner

*Primary Examiner* — Lynda Salvatore
*Assistant Examiner* — Andrew K Bohaty
(74) *Attorney, Agent, or Firm* — Foley & Lardner LLP

(57) ABSTRACT

The present invention provides an organic light emitting device and a fabrication method thereof, comprising a substrate, an anode layer formed on said substrate, an organic function layer formed on said anode layer, and a cathode layer formed on said organic function layer, characterized in that, further comprising a cathode interface modification layer between said organic function layer and said cathode layer, wherein said cathode interface modification layer contains a compound $A_xB_yC_z$, A is an element of Group IA or IIA, B is an element of Group IIIA or VA, C is a hydrogen element, and $1 \leq x \leq 2$, $y \in [0,1]$, $1 \leq z \leq 4$. In the present invention, the cathode interface modification layer is formed after forming a light emitting layer, the cathode interface modification layer contains a compound $A_xB_yC_z$, the electron injection ability at the cathode interface can be improved by adding the cathode interface modification layer, and hence the device performance can be significantly improved. At the same time, the process feasibility of the material is good during the fabrication, and thus the yield of the device can be further improved.

9 Claims, 6 Drawing Sheets

ORGANIC LIGHT EMITTING DEVICE WITH CATHODE INTERFACE MODIFICATION LAYER AND FABRICATION METHOD THEREOF

This application claims priority from Chinese Patent Application 200810104832.2, filed on Apr. 24, 2008. The entire content of the aforementioned application is incorporated herein by reference.

TECHNICAL FIELD OF THE INVENTION

The present invention relates to an organic light emitting device, and more particularly, to an organic light emitting device containing a cathode interface modification layer and a fabrication method thereof.

BACKGROUND OF THE INVENTION

The study of the organic light emitting device (OLED) was begun by A. Bernanose et al. at 1950s. The initially researched material is anthracene single crystal. The required driving voltage is very high (several hundreds volts) since the single crystal is too thick (10-20 μm). An anthracene thin film was made by Vinceet in 1982 via using vacuum evaporation, blue fluorescence was observed under the voltage of 30V, but its external quantum efficiency was only 0.03%. The early organic light-emitting device was high in voltage, low in luminance and efficiency, and thus at a low level. An organic small molecule light-emitting device having a structure of ITO/Diamine/Alq$_3$/Mg:Ag was reported by C. W. Tang and Vanslyke of Eastman Kodak of the USA in 1987. As to the above device, when it was operating under a voltage of 10V, the luminance was up to 1000 cd/m$^2$ and the external quantum efficiency was up to 1.0%, therefore, it had attracted a broad attention of scientists. Subsequently, the news that electroluminescence could also be achieved by using conjugated polymer PPV was firstly reported in Nature by J. H. Burroughes et al in 1990, they fabricated a polymer organic light-emitting device having a structure of ITO/PPV/Ca by spin-on, and the external quantum efficiency of this device was 0.05%. The people saw the possibility of applying the organic light-emitting device into a display from the report above. Then, the curtain was rung up on the research and industrialization of the organic small molecule and the polymer electroluminescence.

High efficiency, long lifetime, and high brightness etc. of the OLED device are the foundation, based on which the industrialization of the OLED device can be realized. The mobility of an electron is lower than that of a hole in general organic material, so it is very important to improve the electron injection efficiency. The barrier of injection of electrons into an organic layer can be decreased by using a metal having low work function (for example, Ca, Mg and so on), and thus the electron injection can be increased. Another method for improving the electron injection is to add a layer of an inorganic compound between a cathode layer and an anode layer. It is demonstrated by practice that LiF/Al is a cathode structure with excellent electron injection ability and is widely used in OLED products. However, the light emitting quenching occurs due to the present of halogen atoms, the material has high toxicity, the temperature at which this material is transformed into a film is high, and there are stick demands on the film thickness of the electron injection layer. When LiAlO$_2$ and Li$_2$CO$_3$ are used as the injection layer material, the lifetime is short and the efficiency is low. Many kinds of materials were proposed by people as the electron injection material at an early stage. However, the scheme, where a compound containing two kinds of elements of Group IA is employed, has not been found as yet.

SUMMARY OF THE INVENTION

An object of the present invention is to provide an organic light emitting device, which has an improved electron injection ability and a markedly increased light-emitting efficiency.

The above object can be achieved by the following solution:

An organic light emitting device according to the present invention, comprising a substrate, an anode layer formed on said substrate, a organic function layer formed on said anode layer, and a cathode layer formed on said organic function layer, characterized in that, further comprising a cathode interface modification layer between said organic function layer and said cathode layer, wherein said cathode interface modification layer contains a compound A$_x$B$_y$C$_z$, A is an element of Group IA or IIA, B is an element of Group IIIA or VA, C is a hydrogen element, and 1≦x≦2, y∈[0,1], 1≦z≦4.

Said compound A$_x$B$_y$C$_z$ comprises KBH$_4$, LiBH$_4$, NaBH$_4$, KAlH$_4$, KH, LiH, Li$_2$NH$_2$ and/or Li$_2$NH.

Said cathode interface modification layer has a thickness of 0.1 nm to 50 nm, preferably 0.5 nm to 10 nm.

Said cathode interface modification layer comprises said compound A$_x$B$_y$C$_z$ doped with a metal material, and a doping ratio of said metal material to said compound A$_x$B$_y$C$_z$ is from 1:10 to 1:1.

Said metal is same with a metal forming said cathode layer.

Said metal is aluminum or silver.

Said cathode layer is fabricated by a vacuum evaporation method or a sputtering method, and said cathode layer is aluminum or silver.

Another object of the present invention is to provide a method for fabricating an organic light emitting device, by which an electron injection ability can be improved and a light-emitting efficiency can be markedly increased.

The object of the present invention can be achieved by the following solution:

A method for fabricating an organic light emitting device, characterized in that:

forming sequentially an anode layer and a organic function layer on a substrate;

forming a cathode interface modification layer comprising a compound A$_x$B$_y$C$_z$ on said organic function layer; and forming a cathode layer on said cathode interface modification layer;

wherein, A is an element of Group IA or IIA, B is an element of Group IIIA or VA, C is a hydrogen element, 1≦x≦2, y∈[0,1], 1≦z≦4.

Said compound A$_x$B$_y$C$_z$ used as said cathode interface modification layer is fabricated by a vacuum evaporation method.

Said cathode modification layer containing an alkali metal hydride is fabricated by vacuum evaporating KBH$_4$, LiBH$_4$, Li$_2$NH$_2$, Li$_2$NH, KAlH$_4$ and/or NaBH$_4$.

Analysis of the mechanics of the present invention is as flows:

The main technical solution of the present invention is that the cathode interface modification layer contains a compound A$_x$B$_y$C$_z$, wherein, A is an element of Group IA or IIA, B is an element of Group IIIA or VA, C is a hydrogen element, 1≦x≦2, y∈[0,1], 1≦z≦4. During evaporation, the compound A$_x$B$_y$C$_z$ is not decomposed or the compound A$_x$B$_y$C$_z$ is decomposed to form a compound A$_m$C$_n$ and A, and the presence of the compound $A_mC_n$ or A in an electron injection layer results in an effective reduction of the electron injection barrier. Once an interface of electron injection with high efficiency is formed, the electron injection barrier is lower, the electron injection is more effective, the balance of electrons and holes in an organic light emitting device is better kept, and the current efficiency is improved.

In the present invention, a cathode interface modification layer is formed after forming a light emitting layer, the cathode interface modification layer contains a compound $A_xB_yC_z$ or decomposed products thereof, the electron injection ability at the cathode interface can be improved by adding the cathode modification layer, and hence the device performance can be significantly improved. At the same time, the process feasibility of the material is good during the fabrication, and thus the yield of the device can be further improved.

In the figures: 10 denotes a substrate, 20 denotes an anode layer, 30 denotes a hole transport layer, 40 denotes a light emitting layer, 50 denotes a cathode interface modification layer (a cathode modification layer), 60 denotes a cathode layer.

DETAIL DESCRIPTION OF THE INVENTION

Hereinafter, the invention will be further explained with the embodiments in conjunction with the accompanying drawings.

Embodiments 1-8 are modes of carrying out the invention wherein a cathode modification layer contains $KBH_4$.

Embodiment 1

Figure 1:
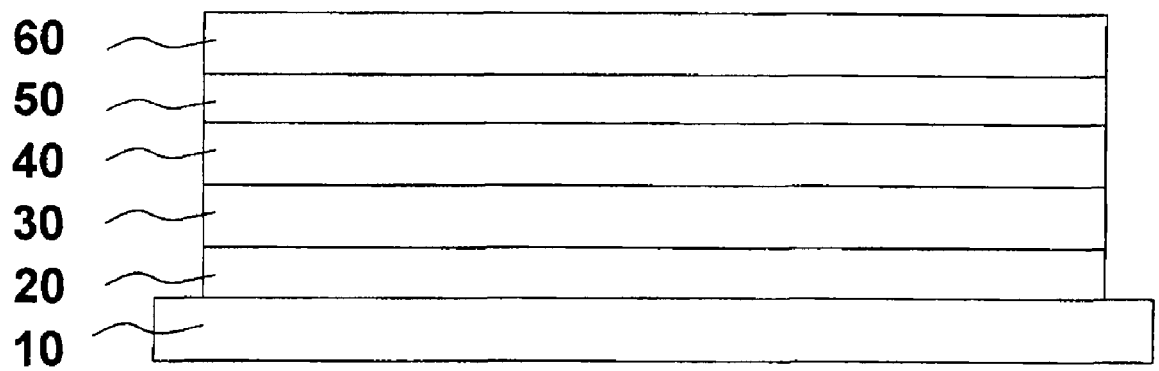
FIG. 1 shows a schematic diagram of a structure of a device according to the present invention.

Refer to FIG. 1, which is a cross-sectional view of a structure of an organic light emitting device of the present embodiment. The organic light emitting device comprises a substrate 10, an anode layer 20, a hole transport layer 30, a light emitting layer 40, a cathode modification layer 50 and a cathode layer 60. The structure of the organic light emitting device of the embodiment of the invention is as follows:

glass substrate/ITO/NPB(50 nm)/$Alq_3$(70 nm)/$KBH_4$(0.2 nm)/Al(150 nm)

1) Fabrication of the Organic Light Emitting Layer

A pre-treated glass substrate is placed in a vacuum chamber. The chamber is evacuated to a pressure of $1 \times 10^{-3}$ Pa. A hole transport material of NPB is evaporated with an evaporation rate of 0.1 nm/s and a thickness of 50 nm. $Alq_3$ is evaporated on the hole injection layer as the light emitting layer and the electron transport layer of the device with a thickness of 70 nm.

The glass substrate comprises an ITO (Indium Tin Oxide) film and a base substrate, the sheet resistance of the ITO film is 50Ω, and the film thickness is 150 nm.

2) Fabrication of the Cathode Modification Layer

After fabricating the electron transport layer, a $KBH_4$ layer with a thickness of 0.2 nm is fabricated by evaporating $KBH_4$ as the cathode modification layer of the device, with an evaporation rate of about 0.01 nm/s and an evaporation temperature of about 350° C.

3) Fabrication of the Cathode Layer

In the inventive device, the cathode layer comprises an Al film with a thickness of 150 nm, wherein the evaporation rate of evaporating the Al film is 1.0 nm/s.

4) Packaging with a Glass Packaging Sheet.

Embodiment 2

Refer to FIG. 1, which is a cross-sectional view of a structure of an organic light emitting device of the present embodiment. The organic light emitting device comprises a substrate 10, an anode layer 20, a hole transport layer 30, a light emitting layer 40, a cathode modification layer 50 and a cathode layer 60. The structure of the organic light emitting device in this embodiment of the invention is as follows:

glass substrate/ITO/NPB(50 nm)/$Alq_3$(70 nm)/$KBH_4$(0.5 nm)/Al(150 nm)

The method of fabricating the organic light emitting device is similar to that mentioned in embodiment 1. The difference therebetween lies in that a $KBH_4$ layer with a thickness of 0.5 nm is fabricated after fabricating the electron transport layer.

Embodiment 3

Refer to FIG. 1, which is a cross-sectional view of a structure of an organic light emitting device of the present embodiment. The organic light emitting device comprises a substrate 10, an anode layer 20, a hole transport layer 30, a light emitting layer 40, a cathode modification layer 50 and a cathode layer 60. The structure of the organic light emitting device in this embodiment of the invention is as follows:

glass substrate/ITO/NPB(50 nm)/$Alq_3$(70 nm)/$KBH_4$(2.0 nm)/Al(150 nm)

The method of fabricating the organic light emitting device is similar to that mentioned in embodiment 1. The difference therebetween lies in that a $KBH_4$ layer with a thickness of 2.0 nm is fabricated after fabricating the electron transport layer.

Embodiment 4

Refer to FIG. 1, which is a cross-sectional view of a structure of an organic light emitting device of the present embodiment. The organic light emitting device comprises a substrate 10, an anode layer 20, a hole transport layer 30, a light emitting layer 40, a cathode modification layer 50 and a cathode layer 60. The structure of the organic light emitting device in this embodiment of the invention is as follows:

glass substrate/ITO/NPB(50 nm)/Alq$_3$(70 nm)/KBH$_4$(5.0 nm)/Al(150 nm)

The method of fabricating the organic light emitting device is similar to that mentioned in embodiment 1. The difference therebetween lies in that a KBH$_4$ layer with a thickness of 5.0 nm is fabricated after fabricating the electron transport layer.

Embodiment 5

Refer to FIG. 1, which is a cross-sectional view of a structure of an organic light emitting device of the present embodiment. The organic light emitting device comprises a substrate 10, an anode layer 20, a hole transport layer 30, a light emitting layer 40, a cathode modification layer 50 and a cathode layer 60. The structure of the organic light emitting device in this embodiment of the invention is as follows:

glass substrate/ITO/NPB(50 nm)/Alq$_3$(70 nm)/KBH$_4$ (10.0nm)/Al(150 nm)

The method of fabricating the organic light emitting device is similar to that mentioned in embodiment 1. The difference therebetween lies in that a KBH$_4$ layer with a thickness of 10.0 nm is fabricated after fabricating the electron transport layer.

Conclusion 1: In the case of the cathode metal of Al, five device structures with different KBH$_4$ cathode interface modification layer thicknesses (i.e. 0.2 nm, 0.5 nm, 2.0 nm, 5.0 nm, and 10.0 nm) of the embodiments 1-5 are compared in their performance. Relationships between current density and voltage, luminance and voltage, and current efficiency and current density are shown in FIGS. 2, 3 and 4, respectively.

Figure 2:
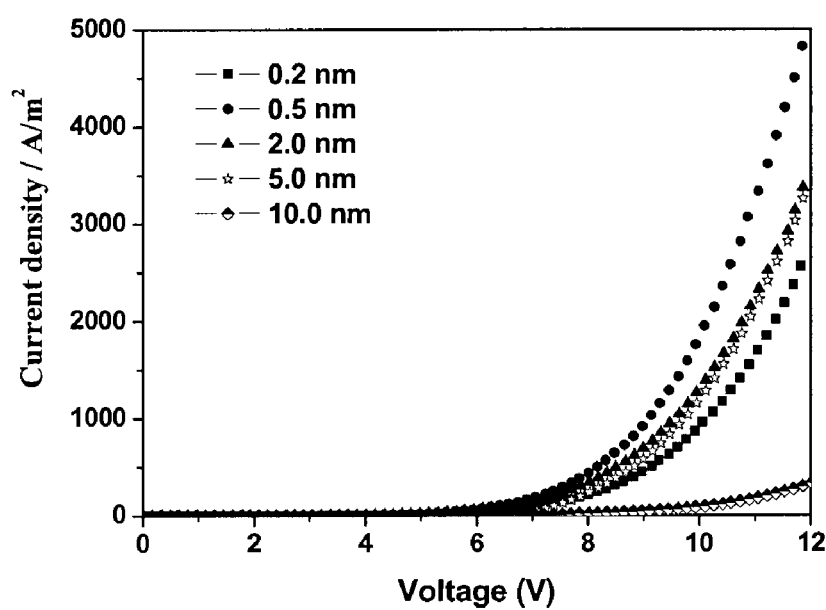
FIG. 2 is a curve of a relationship between current density and voltage of an OLED device having a cathode interface modification layer with different thicknesses according to embodiments 1-5 of the present invention.

As seen in FIG. 2, the curve shifts in a direction of voltage decreasing as the thickness increases when the thickness of KBH$_4$ is less than 0.5 nm; the curve shifts in a direction of voltage increasing as the thickness increases when the thickness of KBH$_4$ is more than 0.5 nm. The performance does not change very much in the range between 0.5 and 5.0 nm, this shows that the KBH$_4$ layer has a wide range of optimal thickness and a better electron injection ability. The optimal thickness of the KBH$_4$ layer is between 0.5 and 5.0 nm.

Figure 3:
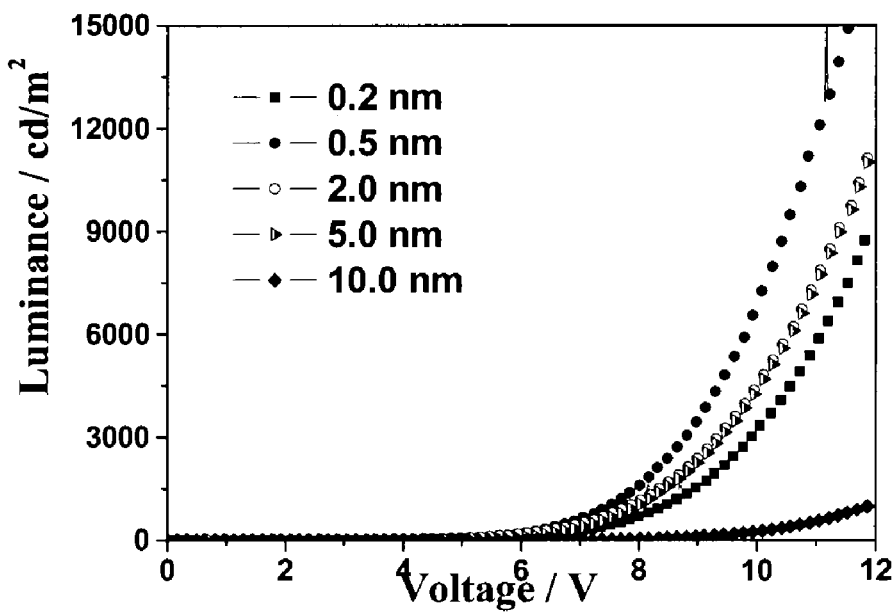
FIG. 3 is a curve of a relationship between luminance and voltage of an OLED device having a cathode interface modification layer with different thicknesses according to embodiments 1-5 of the present invention.

As seen in FIG. 3, the relationships between luminance and voltage exhibit a similar behavior to that of the relationships between current density and voltage, that is, the upper limits (maximum values) of the voltage ranges corresponding to the luminance curves of the devices having a KBH$_4$ layer with a thickness in the range between 0.5 and 5.0 nm are lower than those of the voltage ranges corresponding to the luminance curves of the devices having a KBH$_4$ layer with a thickness that is not in the range between 0.5 and 5.0 nm.

Figure 4:
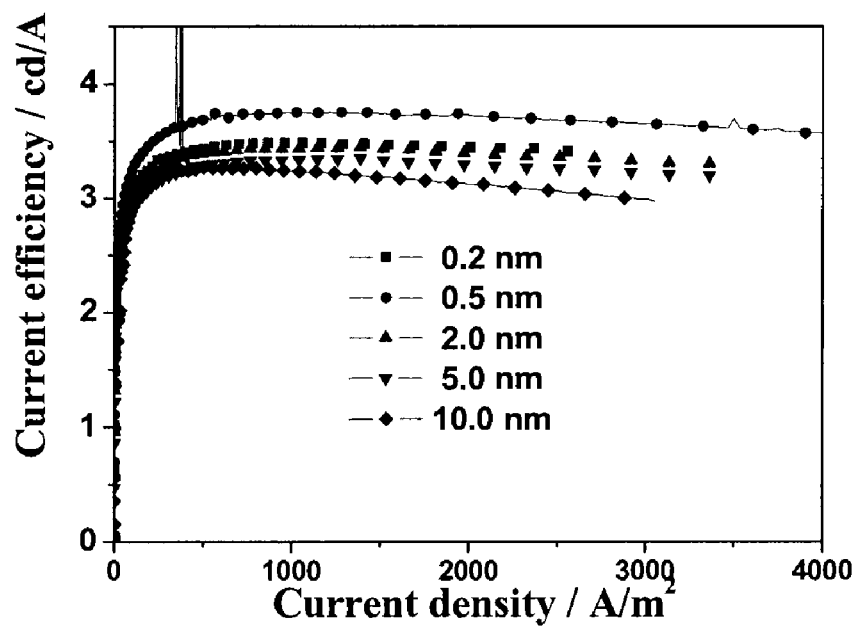
FIG. 4 is a curve of a relationship between current efficiency and current density of an OLED device having a cathode interface modification layer with different thicknesses according to embodiments 1-5 of the present invention.

As can be seen from the relationships between current efficiency and current density shown in FIG. 4, the KBH$_4$ layer with a thickness in the range between 0.5 and 5.0 nm would result in a higher current efficiency. However, the KBH$_4$ layer with a thickness beyond the range would result in reduction of the current efficiency of the device.

Therefore, the preferred thickness range of the KBH$_4$ layer of a KBH$_4$/Al cathode structure is from 0.5 to 5.0 nm.

Embodiment 6

Refer to FIG. 1, which is a cross-sectional view of a structure of an organic light emitting device of the present embodiment. The organic light emitting device comprises a substrate 10, an anode layer 20, a hole transport layer 30, a light emitting layer 40, a cathode modification layer 50 and a cathode layer 60. The structure of the organic light emitting device in this embodiment of the invention is as follows:

glass substrate/ITO/NPB(50 nm)/Alq$_3$(70 nm)/KBH$_4$(0.5 nm)/Ag(150 nm)

The method of fabricating the organic light emitting device is similar to that mentioned in embodiment 2. The difference therebetween lies in that an Ag layer with a thickness of 150 nm is fabricated after fabricating the cathode modification layer.

COMPARATIVE EXAMPLE 1

Refer to FIG. 1, which is a cross-sectional view of a structure of an organic light emitting device of the present example. The organic light emitting device comprises a substrate 10, an anode layer 20, a hole transport layer 30, a light emitting layer 40, a cathode modification layer 50 and a cathode layer 60. The structure of the organic light emitting device in this example of the invention is as follows:

glass substrate/ITO/NPB(50 nm)/Alq$_3$(70 nm)/LiF(0.5 nm)/Al(150 nm)

The method of fabricating the organic light emitting device is similar to that mentioned in embodiment 1. The difference therebetween lies in that a LiF layer with a thickness of 0.5 nm is fabricated after fabricating the electron transport layer.

COMPARATIVE EXAMPLE 2

Figure 5:
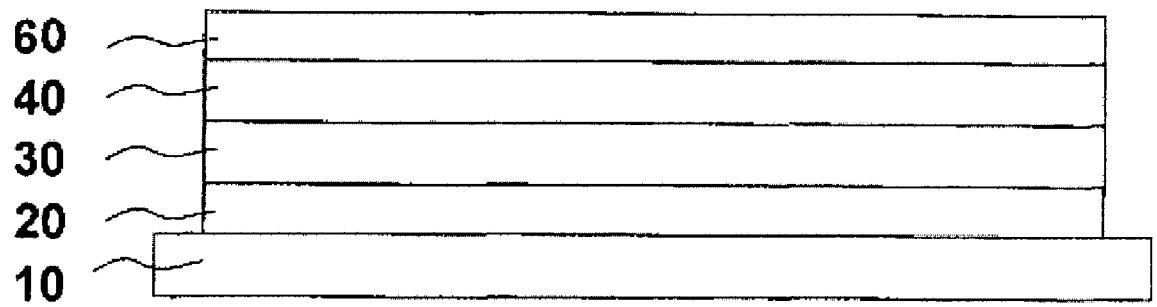
FIG. 5 shows a schematic diagram of a structure of a device according to comparative example 2 of the present invention.

Refer to FIG. 5, which is a cross-sectional view of a structure of an organic light emitting device of the present example. The organic light emitting device comprises a substrate 10, an anode layer 20, a hole transport layer 30, a light emitting layer 40 and a cathode layer 60. The structure of the organic light emitting device in this example of the invention is as follows:

glass substrate/ITO/NPB(50 nm)/Alq$_3$(70 nm)/Ag(150 nm)

The method of fabricating the organic light emitting device is similar to that mentioned in embodiment 6. The difference therebetween lies in that the cathode structure only comprises the metal silver and the electron transport layer is not fabricated.

Conclusion 2: Four different cathode structures of the embodiments 2 and 6 and the comparative examples 1 and 2, i.e. OLED devices with KBH$_4$ 0.5 nm/Al, KBH$_4$ 0.5 nm/Ag, LiF 0.5 nm/Al and Ag respectively, are compared, and the performance of the OLED devices is obtained. The relationships between current density and voltage, luminance and voltage and current efficiency and current density are shown in FIGS. 6, 7 and 8, respectively.

Figure 6:
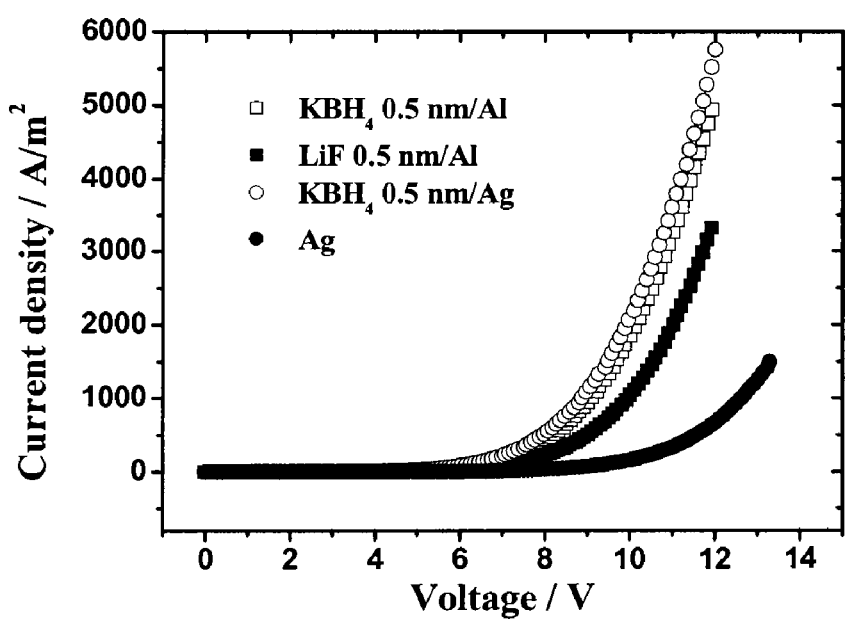
FIG. 6 is a curve of a relationship between current density and voltage of an OLED device having different cathode structures according to embodiments 1 and 6 and comparative examples 1 and 2 of the present invention.

As seen in FIG. 6, the relationships among the current densities at a same voltage corresponding to the current density curves of the devices having different cathode structures are as follows:

KBH$_4$ 0.5 nm/Ag>KBH$_4$ 0.5 nm/Al>LiF 0.5 nm/Al>Ag

Figure 7:
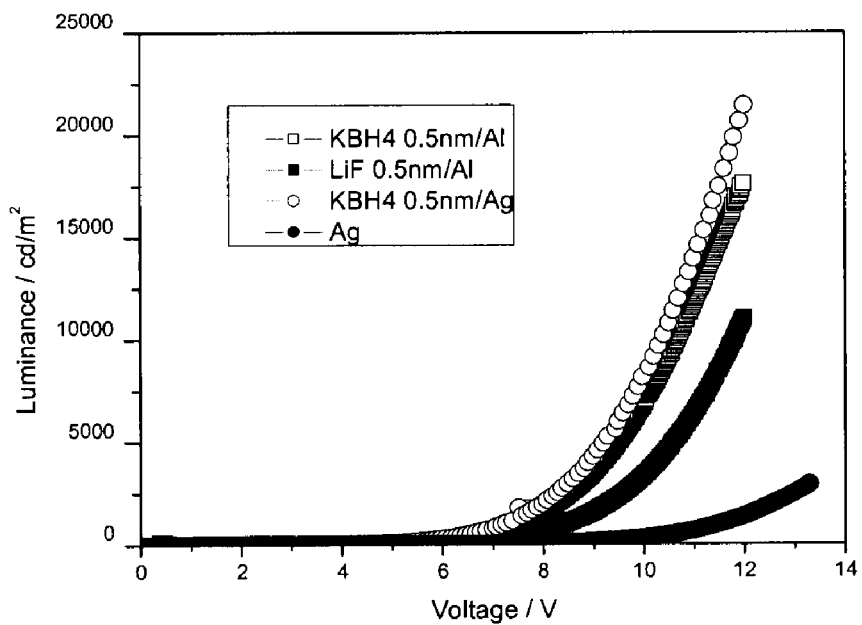
FIG. 7 is a curve of a relationship between luminance and voltage of an OLED device having different cathode structures according to embodiments 1 and 6 and comparative examples 1 and 2 of the present invention.
Figure 8:
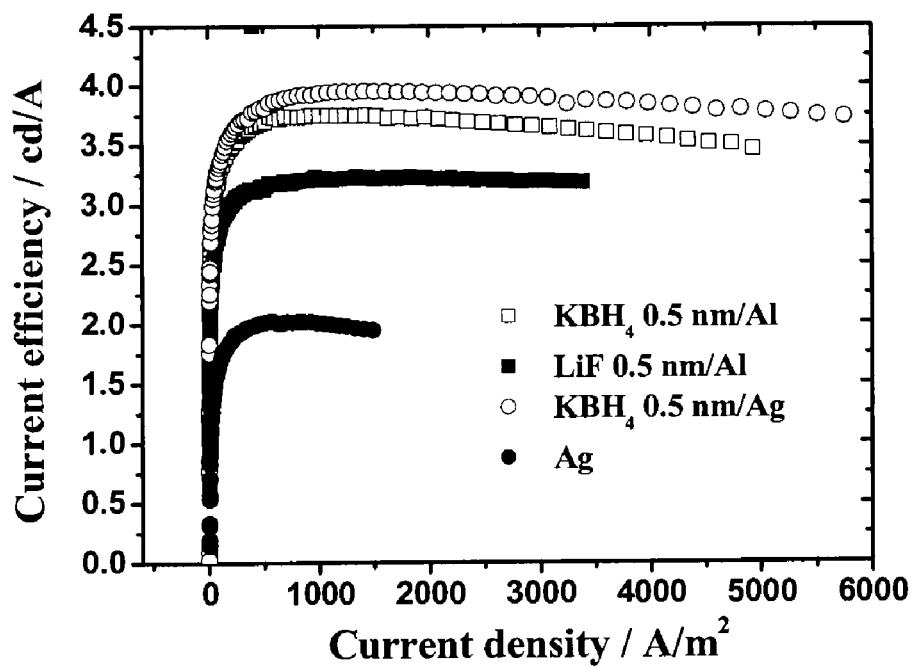
FIG. 8 is a curve of a relationship between current efficiency and current density of an OLED device having different cathode structures according to embodiments 1 and 6 and comparative examples 1 and 2 of the present invention.

As seen in FIG. 7, the relationships among the luminance at a same voltage corresponding to the luminance curves of the devices having different cathode structures are as follows:

KBH$_4$ 0.5 nm/Ag>KBH$_4$ 0.5 nm/Al>LiF 0.5 nm/Al>Ag

As seen in FIG. 8, when the current density is 1000 A/m$^2$, the current efficiencies of the devices having the cathode structures of KBH$_4$ 0.5 nm/Ag, KBH$_4$ 0.5 nm/Al and LiF 0.5 nm/Al are 3.90, 3.75 and 3.20 cd/A, respectively. So the device having the cathode structure of KBH$_4$ 0.5 nm/Ag has the maximum current efficiency. The performance of the devices having the cathode structures of $KBH_4$ 0.5 nm/Ag and $KBH_4$ 0.5 nm/Al is increased by 21.9% and 17.2%, respectively, compared with that of the device having the cathode structure of LiF 0.5 nm/Al.

Embodiment 7

Refer to FIG. 1, which is a cross-sectional view of an organic light emitting device of the present embodiment. The organic light emitting device comprises a substrate 10, an anode layer 20, a hole transport layer 30, an light emitting layer 40, a cathode modification layer 50 and a cathode layer 60. The structure of the organic light emitting device in this embodiment of the invention is as follows:

glass substrate/ITO/NPB(50 nm)/$Alq_3$(70 nm)/$KBH_4$:Ag (1:10) (10 nm)/Ag(150 nm)

The method of fabricating the organic light emitting device is similar to that mentioned in embodiment 1. The difference therebetween lies in that an Ag layer with a thickness of 150 nm is fabricated after fabricating the cathode modification layer.

The comparison results of the embodiments 6 with 7 are shown in table 1.

TABLE 1

| | Cathode structure | Efficiency of double-side light emitting |
|---|---|---|
| Embodiment 6 | $KBH_4$ (0.5 nm)/Ag(150 nm) | 3.9 cd/A |
| Embodiment 7 | $KBH_4$:Ag(1:10)(10 nm)/Ag(150 nm) | 4.0 cd/A |

Conclusion 3: It can be seen from the comparison results that the performance of the device where the Ag is doped in the $KBH_4$ layer is better than the device where the Ag is not doped in the $KBH_4$ layer.

Embodiment 8

Refer to FIG. 1, which is a cross-sectional view of an organic light emitting device of the present embodiment. The organic light emitting device comprises a substrate 10, an anode layer 20, a hole transport layer 30, an light emitting layer 40, a cathode modification layer 50 and a cathode layer 60. The structure of the organic light emitting device in this embodiment of the invention is as follows:

glass substrate/ITO/NPB(50 nm)/$Alq_3$(70 nm)/$KBH_4$ (0.5nm)/Ag(20 nm)

The method of fabricating the organic light emitting device is similar to that mentioned in embodiment 2. The differences therebetween lie in that the Ag cathode layer with a thickness of 20 nm is fabricated after fabricating the cathode modification layer and the device in this embodiment is a double-side light emitting device.

Embodiment 9

Refer to FIG. 1, which is a cross-sectional view of an organic light emitting device of the present embodiment. The organic light emitting device comprises a substrate 10, an anode layer 20, a hole transport layer 30, an light emitting layer 40, a cathode modification layer 50 and a cathode layer 60. The structure of the organic light emitting device in this embodiment of the invention is as follows:

glass substrate/ITO/NPB(50 nm)/$Alq_3$(70 nm)/$KBH_4$:Ag [1:10](10 nm)/Ag(10 nm)

$KBH_4$:Ag[1:10](10 nm) means that the ratio of $KBH_4$ to Ag in the cathode modification layer is 1:10 and the thickness thereof is 10 nm; and the layer is fabricated by a co-evaporation with two or more sources.

The method of fabricating the organic light emitting device is similar to that mentioned in embodiment 1. The differences therebetween lie in that a $KBH_4$ and Ag co-doped layer with a thickness of 10 nm is fabricated after fabricating the light emitting layer and an Ag layer with a thickness of 10 nm is fabricated after fabricating the cathode modification layer.

In this embodiment, the cathode layer of Ag has a thickness of 10 nm, and the device is a double-side light emitting device.

The comparison results of the embodiments 8 with 9 are shown in table 2.

TABLE 2

| | Cathode structure | Efficiency of double-side light emitting |
|---|---|---|
| Embodiment 8 | $KBH_4$ (0.5 nm)/Ag (20 nm) | 3.0 cd/A |
| Embodiment 9 | $KBH_4$:Ag(1:10) (10 nm)/Ag (10 nm) | 3.2 cd/A |

Conclusion 4: It can be seen from the comparison results that the device has a high efficiency even if the thickness of Ag is reduced. The advantage of the device with this structure is that the light can be emitted from the cathode side. Accordingly, a top-side or double-side light emitting device can be fabricated.

Embodiments 10 and 11 are modes of carrying out the invention wherein a cathode modification layer contains $LiBH_4$.

Embodiment 10

Refer to FIG. 1, which is a cross-sectional view of an organic light emitting device of the present embodiment. The organic light emitting device comprises a substrate 10, an anode layer 20, a hole transport layer 30, an light emitting layer 40, a cathode modification layer 50 and a cathode layer 60. The structure of the organic light emitting device in this embodiment of the invention is as follows:

glass substrate/ITO/NPB(50 nm)/$Alq_3$(70 nm)/$LiBH_4$(0.5 nm)/Al(150 nm)

The method of fabricating the organic light emitting device is similar to that mentioned in embodiment 2. The difference therebetween lies in that a $LiBH_4$ layer with a thickness of 0.5 nm is fabricated after fabricating the electron transport layer.

Embodiment 11

Refer to FIG. 1, which is a cross-sectional view of an organic light emitting device of the present embodiment. The organic light emitting device comprises a substrate 10, an anode layer 20, a hole transport layer 30, an light emitting layer 40, a cathode modification layer 50 and a cathode layer 60. The structure of the organic light emitting device in this embodiment of the invention is as follows:

glass substrate/ITO/NPB(50 nm)/$Alq_3$(70 nm)[$LiBH_4$] (1.0 nm)/Al(150 nm)

The method of fabricating the organic light emitting device is similar to that mentioned in embodiment 1. The difference therebetween lies in that a $LiBH_4$ layer with a thickness of 1.0 nm is fabricated after fabricating the electron transport layer.

Conclusion 5: In the case of the cathode metal of Al, two device structures with different thicknesses of $LiBH_4$ cathode interface modification layer (i.e. 0.5 nm, 1.0 nm) of the embodiments 10 and 11 are compared in their performance. The relationships between current density and voltage, luminance and voltage and current efficiency and current density are shown in FIGS. 9, 10 and 11, respectively.

Figure 9:
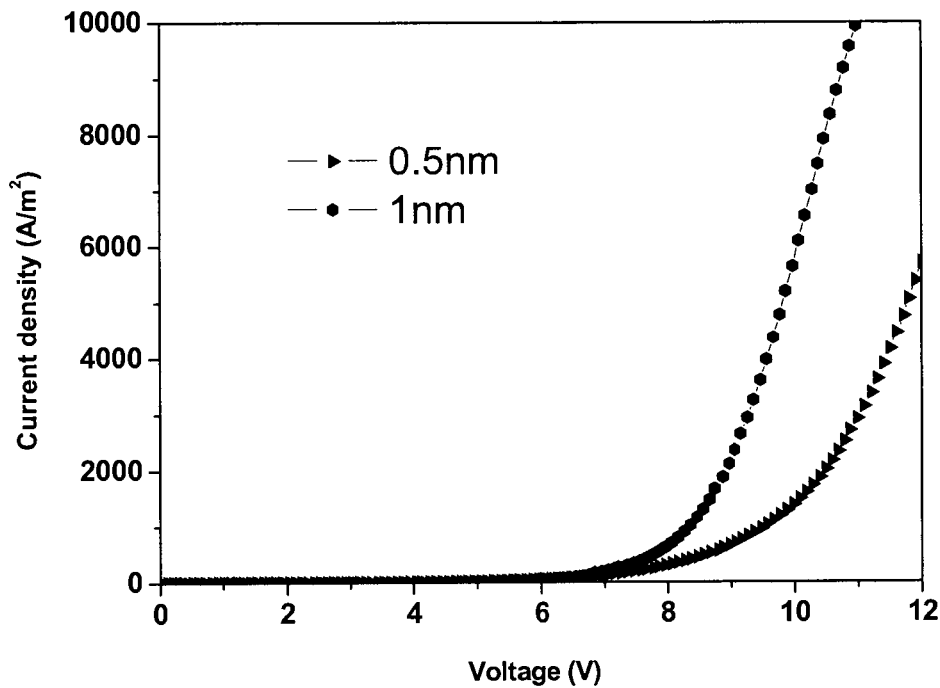
FIG. 9 is a curve of a relationship between current density and voltage of an OLED device having a cathode interface modification layer with different thicknesses according to embodiments 10-11 of the present invention.

As seen in FIG. 9, the curve shifts in a direction of voltage increasing as the thickness decreases when the thickness of $LiBH_4$ is less than 1.0 nm. This shows that the $LiBH_4$ layer with a thickness of 1.0 nm has a better electron injection ability.

Figure 10:
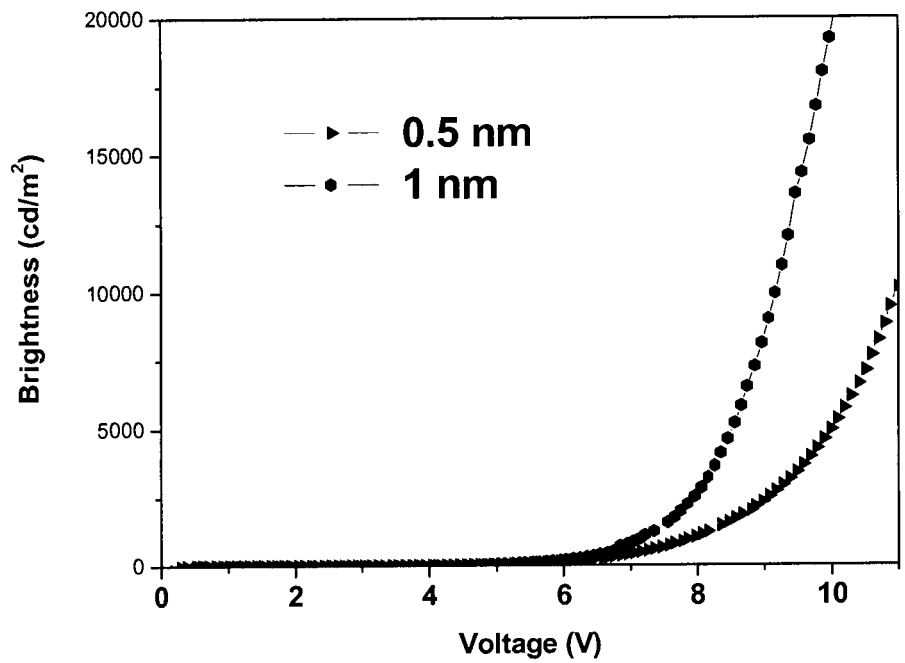
FIG. 10 is a curve of a relationship between luminance and voltage of an OLED device having a cathode interface modification layer with different thicknesses according to embodiments 10-11 of the present invention.

As seen in FIG. 10, the relationships between luminance and voltage exhibit a similar behavior to that of the relationships between current density and voltage, that is, the upper limit of the voltage range corresponding to the luminance curve of the device having a LiBH$_4$ layer with a thickness of 1.0 nm is lower than that of the voltage range corresponding to the luminance curve of the device having a LiBH$_4$ layer with a thickness of 0.5 nm.

Figure 11:
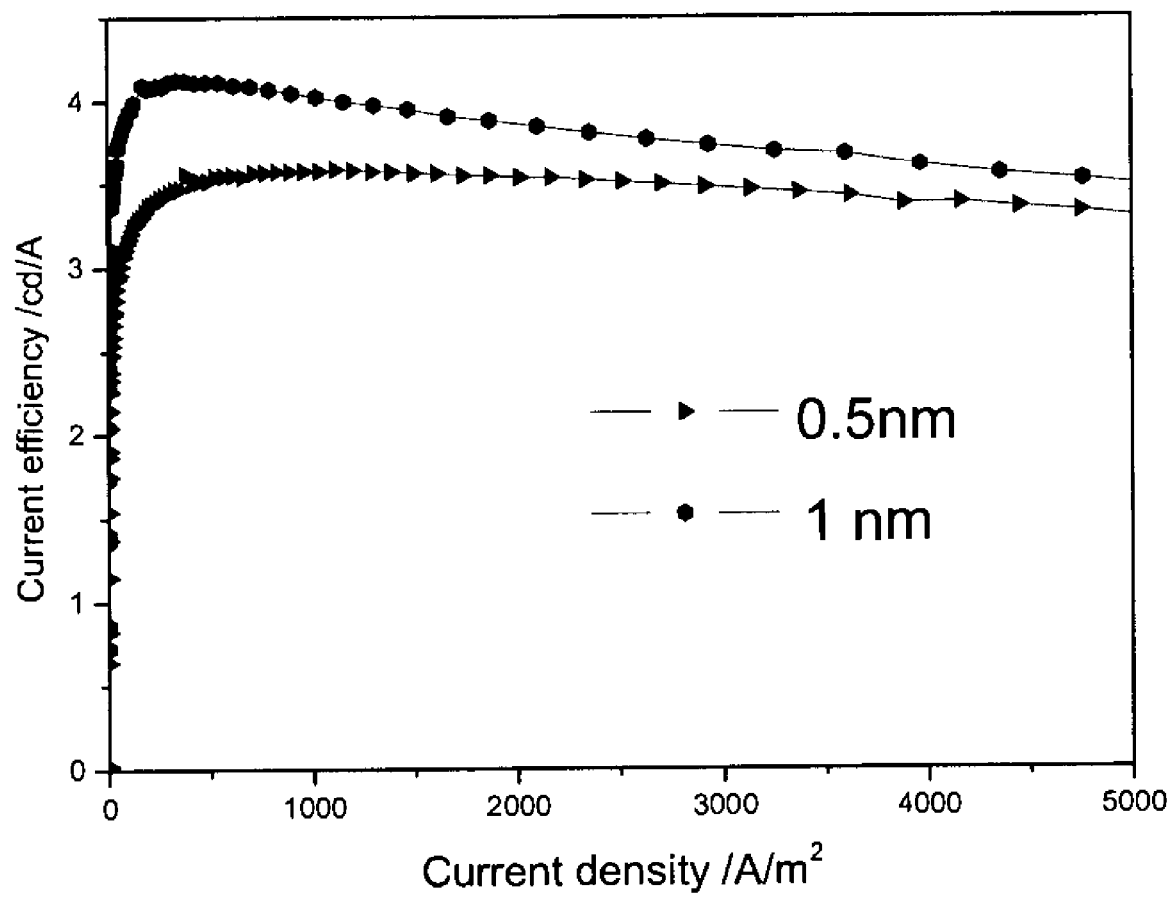
FIG. 11 is a curve of a relationship between current efficiency and current density of an OLED device having a cathode interface modification layer with different thicknesses according to embodiments 10-11 of the present invention.

As can be seen from the relationships between current efficiency and current density shown in FIG. 11, the LiBH$_4$ layer with a thickness of 1.0 nm would result in a higher current efficiency. However, the LiBH$_4$ layer with a thickness more or less than 1.0 nm would result in reduction of the current efficiency of the device.

Therefore, the preferred thickness of the LiBH$_4$ layer of a LiBH$_4$/Al cathode structure is 1.0 nm.

Embodiment 12

If the preferred thickness of KBH$_4$ is in the range between 2.0 nm and 5.0 nm, the cathode can be fabricated by a sputtering method. KBH$_4$ is used not only to protect the organic layer but also to improve the electron injection ability. The cathode can be made of Ag, Al and so on.

| | Cathode structure | Efficiency of light emitting |
| --- | --- | --- |
| Embodiment 12 | KBH$_4$ (5 nm)/Al (200 nm) fabricated by sputtering | 3.3 cd/A |

Although the preferred embodiments of the present invention have been described above, they are not intended to limit the present invention, and various other changes and modifications may be made by those skilled in the art without departing from the sprit and scope of the present invention as defined by the accompanying claims.

The invention claimed is:

1. An organic light emitting device, comprising a substrate, an anode layer formed on said substrate, an organic function layer formed on said anode layer, and a cathode layer formed on said organic function layer, and further comprising a cathode interface modification layer between said organic function layer and said cathode layer, wherein said cathode interface modification layer contains a compound $A_xB_yC_z$ and/or a mixture formed by decomposing said compound $A_xB_yC_z$, where A is an element of Group IA or IIA, B is an element of Group IIIA or VA, and C is a hydrogen element, and $1 \leq x \leq 2$, $y \in [0,1]$, $1 \leq z \leq 4$, said mixture comprises one of KH or K, and said compound $A_xB_yC_z$ comprises one of KBH$_4$ NaBH$_4$ or KAlH$_4$.

2. The organic light emitting device according to claim 1, wherein said cathode interface modification layer has a thickness of 0.1 nm to 50 nm.

3. The organic light emitting device according to claim 2, wherein said cathode interface modification layer has a thickness of 0.5 nm to 10 nm.

4. The organic light emitting device according to claim 1, wherein said cathode interface modification layer comprises said compound $A_xB_yC_z$ and/or said mixture doped with a metal material, and a doping ratio of said metal material to said compound $A_xB_yC_z$ and/or said mixture is from 10:1 to 1:1.

5. The organic light emitting device according to claim 4, wherein said metal is same as a metal forming said cathode layer.

6. The organic light emitting device according to claim 5, wherein said metal is aluminum or silver.

7. The organic light emitting device according to claim 1, wherein said cathode layer is fabricated by a vacuum evaporation method or a sputtering method.

8. The organic light emitting device according to claim 7, wherein said cathode layer is aluminum or silver.

9. A method for fabricating an organic light emitting device, comprising:
   forming sequentially an anode layer and an organic function layer on a substrate;
   forming a cathode interface modification layer containing a compound $A_xB_yC_z$ on said organic function layer, wherein said compound $A_xB_yC_z$, comprises one of KBH$_4$ NaBH$_4$ or KAlH$_4$; and
   forming a cathode layer on said cathode interface modification layer;
   wherein A is an element of Group IA or IIA, B is an element of Group IIIA or VA, and C is a hydrogen element, and $1 \leq x \leq 2$, $y \in [0,1]$, $1 \leq z \leq 4$,
   wherein said cathode interface modification layer contains an alkali metal hydride fabricated by vacuum evaporating one of KBH$_4$, KAlH$_4$ or NaBH$_4$.

* * * * *